United States Patent [19]

Ryczek

[11] Patent Number: 4,560,892
[45] Date of Patent: Dec. 24, 1985

[54] ONE-SHOT DELAY TIMER

[75] Inventor: Lawrence J. Ryczek, Nashotah, Wis.

[73] Assignee: Eaton Corporation, Cleveland, Ohio

[21] Appl. No.: 509,949

[22] Filed: Jun. 30, 1983

[51] Int. Cl.[4] .................. H03K 5/13; H01M 47/18
[52] U.S. Cl. ............................. 307/597; 307/246; 307/247 R; 361/196
[58] Field of Search .................. 307/590–605, 307/246, 247 R, 571; 361/75, 196

[56] References Cited

U.S. PATENT DOCUMENTS

| | | | |
|---|---|---|---|
| 3,755,695 | 8/1973 | Krick et al. | 307/595 |
| 3,794,857 | 2/1974 | Milovancevic | 307/595 |
| 3,950,657 | 4/1976 | Sheng et al. | 307/593 |
| 4,047,058 | 9/1977 | Green | 307/595 |

Primary Examiner—Stanley D. Miller
Assistant Examiner—B. P. Davis
Attorney, Agent, or Firm—Andrus, Sceales, Starke & Sawall

[57] ABSTRACT

A one-shot delay timer 4 is provided by a pair of comparator timers 14 and 18. The first comparator timer 14 responds to an input signal and provides a delayed output initiating the output pulse. The second comparator timer 18 provides a delayed output terminating the output pulse. The delayed output pulse of controlled length is generated for each input signal except when a second input signal occurs before the termination of the one-shot output pulse. The delayed output pulse is generated regardless of the duration of the input signal, even if the input signal lasts longer than the termination of the output pulse. Timer 4 is ideal for proximity switch applications, particularly photoelectric type proximity switches, for providing a delayed output signal following a given sensed condition.

16 Claims, 2 Drawing Figures

ONE-SHOT DELAY TIMER

BACKGROUND AND SUMMARY

The invention provides a timed delay circuit generating a one-shot output pulse in response to an input signal. The length of the timed delay between the input signal and the initiation of the one-shot output pulse is controlled. The timed delay until termination of the output pulse, i.e. the length or duration of the output pulse, is also controlled.

The delayed output pulse of controlled length is generated for each input signal except when a second input signal occurs before the termination of the output pulse. The delayed output pulse of controlled length is generated regardless of the duration of the input signal, even if the input signal lasts longer than the termination of the output pulse. If a second input signal occurs during the timed delay before initiation of a first output pulse or during the first output pulse itself, then a correspondent second output pulse is not generated. If the second input pulse occurs after termination of the first output pulse, then a second output pulse is generated, having a delayed initiation and controlled length.

The circuit is characterized by expanded timing range, reduced power consumption and improved adjustment resolution. Though not limited thereto, the circuit was developed for proximity switches and is particularly useful in photoelectric type proximity switches for providing a delayed output signal following a given sensed condition. The wide range together with the low power consumption makes the circuit ideal for such proximity switch application.

DETAILED DESCRIPTION

Figure 1:
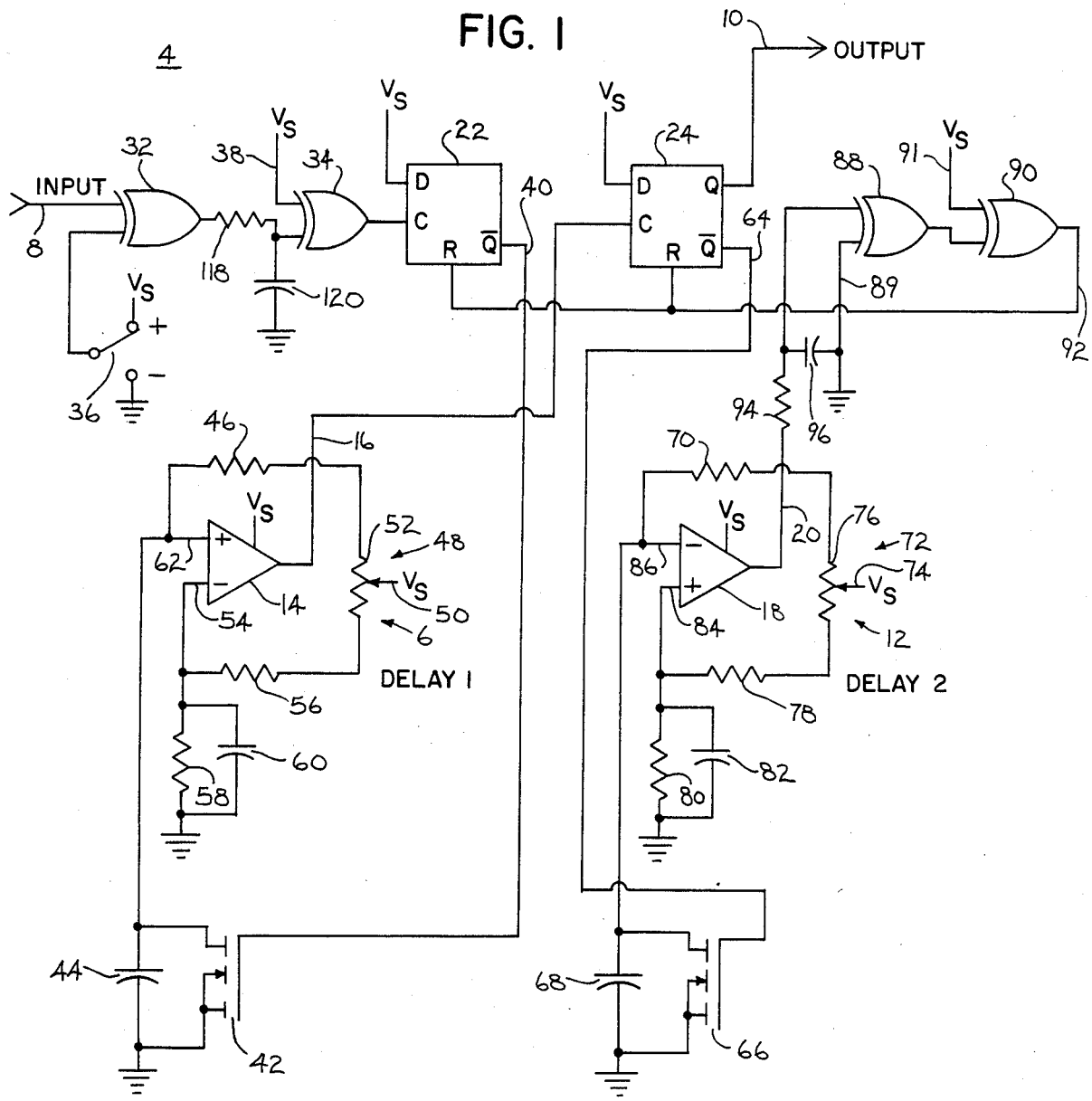
FIG. 1 is a circuit diagram of a one-shot delay timer constructed in accordance with the invention.

FIG. 1 shows a one-shot delay timer 4 comprising first delay means 6 responsive to an input signal at line 8 and initiating an output pulse at line 10 after a given delay, and second delay means 12 terminating the output pulse after a given delay, to control the length of the output pulse. Means are provided for resetting the first and second delay means at the termination of the output pulse, to be described. The delayed output pulse of controlled length is generated for each input signal except when a second input signal occurs before the termination of the output pulse. The delayed output pulse of controlled length is generated regardless of the duration of the input signal, even if the input signal lasts longer than the termination of the output pulse.

In the disclosed embodiment, the first delay means 6 comprises a first comparator timer 14, such as an operational amplifier, responsive to the input signal and providing a delayed output on line 16 initiating the output pulse. Second delay means 12 comprises a second comparator timer 18, such as an operational amplifier, providing a delayed output on line 20 terminating the output pulse. The second comparator timer 18 is preferably responsive to the initiation of the output pulse for providing a delayed output terminating the output pulse, for controlling the length or duration of the latter.

Gate means including first and second flipflops 22 and 24 are provided for resetting the first and second comparator timers 14 and 18, respectively, at the termination of the output pulse. Flip-flop means 22, 24 outputs the output pulse on line 10, is clocked to initiate the output pulse, and is reset to terminate the output pulse and to reset the first and second comparator timers 14 and 18.

Figure 2:
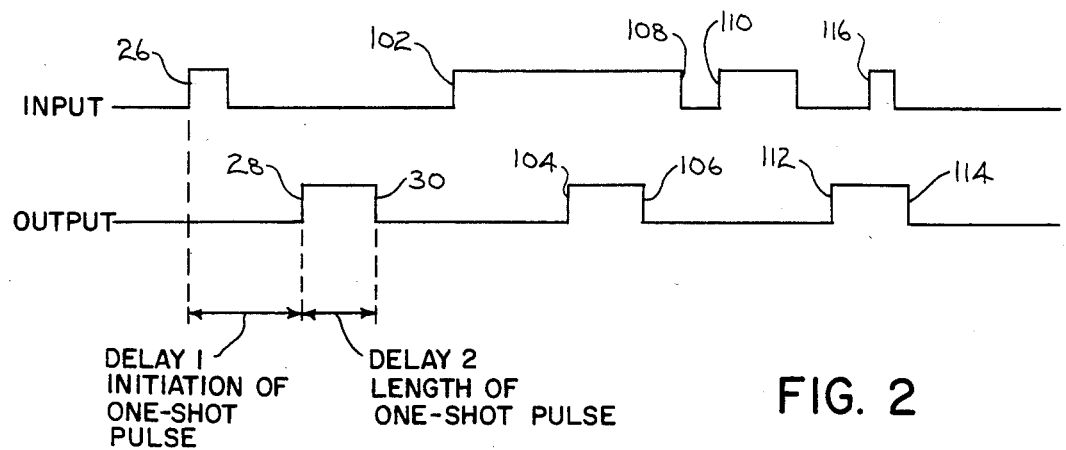
FIG. 2 is a timing diagram illustrating operation of the circuit of FIG. 1.

In operation, a positive-going transition 26, FIG. 2, of the input signal on line 8 causes clocking of flip-flop 22 which enables the first delay circuit 6 to begin timing. The timed delay output of the first delay circuit on line 16 clocks flip-flop 24, which initiates the output pulse on line 10 at transition 28, FIG. 2, and which also enables the second delay circuit 12 to begin timing. The timed delay output of the second delay circuit on line 20 resets flip-flops 22 and 24 and terminates the output pulse, as shown at transition 30, FIG. 2.

Circuit operation will now be described in greater detail. The input signal on line 8 is provided through input gate means, comprising XOR gates 32 and 34, to the clock input of flip-flop 22. One of the inputs to XOR gate 32 is the input signal on line 8, and the other input is from a switch 36 selectively connectable to a plus or minus polarity. In the plus polarity mode of selection switch 36, and when the input signal transitions high at 26, FIG. 2, then both inputs to XOR gate 32 are high, and the output of the latter goes low. This low state at one of the inputs to XOR gate 34 together with the high state at the other input on line 38 causes the input of gate 34 to go high, which positive-going edge transition clocks flip-flop 22. In the disclosed embodiment, the timing delays are edge triggered, though level triggering, etc., may also be used.

When flip-flop 22 is clocked, its $\overline{Q}$ output on line 40 goes low, since the D input is tied high. The low state on line 40 renders switch means 42, such as a field effect transistor, nonconductive. Nonconduction of FET 42 enables capacitor 44 to charge through resistor 46 from potentiometer 48.

Potentiometer 48 includes a voltage source connected through a wiper 50 to a variable point along a pot resistor 52. The lower end of the pot resistor is connected to a reference input terminal 54 of comparator 14, such as the minus terminal of an operational amplifier. The lower end of pot resistor 52 is preferably connected to terminal 54 through a voltage divider network comprising resistors 56 and 58, which may include a protective bypass capacitor 60. The upper end of pot resistor 52 is connected through an RC circuit, comprising resistor 46 and capacitor 44, to a comparing input terminal 62 of comparator 14, such as the plus terminal of an operational amplifier.

When wiper 50 is moved downwardly, the threshold trip voltage at reference input terminal 54 is increased, and the charging current through resistor 46 to capacitor 44 is decreased, such that it takes longer for the voltage at comparing input terminal 62 to rise in a given polarity direction above the voltage in reference input terminal 54. When wiper 50 is moved upwardly, the threshold trip voltage at reference input terminal 54 is decreased, and the charging current to capacitor 44 is increased, such that it takes less time for the voltage at comparing input terminal 62 to rise above the voltage at reference input terminal 54.

The state of output 16 of comparator 14 is determined by the state of comparing input terminal 62 relative to reference input terminal 54. When input terminal 62 goes positive relative to input terminal 54, then output terminal 16 goes high. The timed delay is controlled by the setting of potentiometer 48, which controls the reference voltage and the charging rate of capacitor 44.

When the output of the first delay circuit 6 transitions high on line 16, flip-flop 24 is clocked by such transition. The D input of flip-flop 24 is tied high, and thus at clocking the Q output on line 10 goes high as shown at transition 28, FIG. 2. Also at clocking, the $\overline{Q}$ output on line 64 goes low which renders switch means 66, such as a field effect transistor, nonconductive. Nonconduction of FET 66 enables charging of capacitor 68 through resistor 70 from potentiometer 72, comparably to the first delay circuit 6. Potentiometer 72 includes wiper 74 connected to a variable point along pot resistor 76. The lower end of pot resistor 76 is connected through a voltage divider network, comprising resistors 78 and 80, and bypass protective capacitor 82, to a reference input terminal 84, which in the second delay circuit is the plus terminal of an operational amplifier. The upper end of pot resistor 76 is connected through RC means 70, 68 to the comparing input terminal 86 of comparator 18, which in the second delay circuit is the minus terminal of an operational amplifier. Potentiometer 72 controls the timed delay until comparing input terminal 86 is charged to a voltage above that at reference input terminal 84, at which time the output on line 20 goes low.

The output of second comparator timer 18 is connected through intermediate gate means, comprising XOR gates 88 and 90, to the reset inputs of flip-flops 22 and 24. One of the inputs to XOR gate 88 is tied low on line 89 such that when its other input on line 20 goes low, the output of gate 88 goes low. One of the inputs to gate 90 is tied high on line 91 such that when its other input from gate 88 goes low, the output of gate 90 goes high on line 92 which resets flip-flops 22 and 24. An RC network, comprising resistor 94, and capacitor 96, is connected between the output of second delay circuit 12 and intermediate gates 88, 90, to delay the output of second delay circuit 12 and prevent loop oscillation The high state on line 92 resets flip-flop 24 such that its Q output on line 10 goes low, as shown at transition 30, FIG. 2. The high state on line 92 resets flip-flops 22 and 24 such that their $\overline{Q}$ outputs on lines 40 and 64 go high to thus render respective FETs 42 and 66 conductive. When FET 42 is conductive, charging of capacitor 44 is disable due to the alternate parallel current path through FET 42. In this disabled mode, capacitor 44 remains uncharged such that the voltage at comparing input terminal 62 does not rise above that at reference input terminal 54, and the output on line 16 does not transition.

When FET 42 is rendered nonconductive, as controlled by the gate means including flip-flop 22, then charging of capacitor 44, is enabled. In this enabled mode, the charging of capacitor 44 causes voltage to rise at comparing input terminal 62 such that the output of comparator 14 on line 16 transitions after a given delay when the voltage at input terminal 62 exceeds that at reference input terminal 54. The charging enabled and disabled modes provided by switch means 66 is comparable, and controlled by flip-flop 24.

The output gate means provided by the flip-flops responds to both comparator timers 14 and 16 for initiating and terminating the output pulse on line 10. Switch means 42 and 66 are responsive to such output gate means for discharging their respective capacitors 44 and 68 to reset respective comparator timers. For example, when FET 42 is conductive, it rapidly discharges capacitor 44.

The output gate means, comprising flip-flops 22 and 24, responds to the input signal from line 10, and controls first switch 42 to enable charging of first comparator timer 14. The second flip-flop 24 is responsive to the delayed output of the first comparator timer 14 to initiate the output pulse on line 10, transition 28, and also controls the second switch 66 to enable charging of the second comparator timer 18. Both flip-flops 22 and 24 are responsive to the delayed output of second comparator timer 18 to terminate the output pulse, transition 30, and also to switch both switches 42 and 66 to discharge both capacitors 44 and 68, and reset both comparator timers 14 and 18.

As seen in FIG. 2, an input signal transitioning at 102 will cause a one-shot delayed output pulse of controlled length, beginning at transition 104 and terminating at transition 106, regardless of the duration of the input signal. As seen, the input signal does not terminate until transition 108, which is subsequent to the termination of the output pulse at 106. The length of the delay between transitions 102 and 104 is the same as the length of the delay between transitions 26 and 28, which delay is provided by the first delay circuit 6 controlling the timed delay for initiation of the oneshop pulse. The length of the output pulse between transitions 104 and 106 is the same as the length of the pulse between transitions 28 and 30, which duration is controlled by the second delay circuit 12.

Input signal transition 110 causes initiation of the output pulse at transition 112, and termination at 114. The delayed output pulse of controlled length is generated for each input signal except when a second input signal occurs before the termination of the output pulse, as shown at a second input signal transition at 116 occurring during an output pulse before the latter's termination at 114. The input signal at 116 will not generate subsequent delayed output pulse.

Input polarity selection switch 36 provides interchangeable leading-edge or trailing-edge triggering. With switch 36 in its downward position to the minus polarity, trailing or negative-going edge transition triggering is provided. In such implementation, first delay circuit 6 begins timing upon the negative-going transition of the input signal, and the one shot output pulse is initiated at the end of the timed delay following the falling edge of the input signal. The output pulse is terminated by the second delay circuit 12 after a timed delay following initiation of the one shot output pulse.

In the implemented embodiment, comparator timers 14 and 18 are provided by ICL7631 op amps configured for 10 microampere bias current. Resistor 118 and capacitor 120 provide a delay to prevent loop oscillation. Resistor 118 is 100 kilo ohms, resistor 94 is 10 kilo ohms, resistors 46, 58, 70 and 80 are 200 kilo ohms, 56 and 78 are 33 kilo ohms, pot resistors 52 and 76 are 2 megohms, capacitors 120, 96, 60 and 82 are 0.01 microfarad, capacitors 44 and 68 are 4.7 microfarads. With trimmers 52 and 76 set at their midpoint, approximately 1 megohm on either side of the wiper, the power supply current drain is at a minimum of 35 microamperes. Power supply current drain will be maximum at the trimmer end points. This current is well under 100 microamps. The timing range for each delay circuit 6 and 12 is about 0.1 second to about 20 seconds. This range may be changed for either or both delay circuits 6 and 12 to 0.01 to 2.0 seconds by changing capacitors 44 and/or 68 to 0.47 microfarad.

It is recognized that various modifications are possible within the scope of the appended claims.

I claim:

1. A one-shot delay timer comprising:
   first delay means responsive to an input signal and initiating an output pulse after a given delay; and
   second delay means terminating said output pulse after a given delay, to control the length of said output pulse;
   wherein said delayed output pulse of controlled length is generated for each said input signal except when a second input signal occurs before the termination of said output pulse;
   wherein said delayed output pulse is controlled length is generated regardless of the duration of said input signal, even if said input signal lasts longer than the termination of said output pulse; and wherein:
   said first delay means comprises a first comparator timer responsive to edge triggered timing initiation by said input signal and providing a delayed output initiating said output pulse; and
   said second delay means comprises a second comparator timer providing a delayed output terminating said output pulse.

2. A one-shot delay timer comprising:
   first delay means responsive to an input signal and initiating an output pulse after a given delay; and
   second delay means terminating said output pulse after a given delay, to control the length of said output pulse;
   wherein:
   said delayed output pulse of controlled length is generated for each said input signal except when a second input signal occurs before the termination of said output pulse;
   said delayed output pulse of controlled length is generated regardless of the duration of said input signal, even if said input signal lasts longer than the termination of said output pulse;
   said first delay means comprises a first comparator timer responsive to said input signal and providing a delayed output initiating said output pulse;
   said second delay means comprises a second comparator timer providing a delayed output terminating said output pulse;
   said input signal is provided to said first comparator timer through edge triggered input gate means including polarity selection switch means for interchangeably selecting a positive-going or negative-going transition of said input signal to trigger said delay.

3. The invention according to claim 1 wherein said second comparator timer is responsive to said initiation of said output pulse for providing said delayed output terminating said output pulse.

4. The invention according to claim 3 comprising gate means including flip-flop means for resetting said first and second comparator timers at said termination of said output pulse.

5. The invention according to claim 4 wherein said flip-flop means outputs said output pulse, said flip-flop means being clocked to initiate said output pulse, and being reset to terminate said output pulse and to reset said first and second comparator timers.

6. The invention according to claim 1 wherein each of said comparator timers includes RC means, and switch means for enabling and disabling charging of the capacitors of said RC means, and comprising output gate means responsive to both of said comparator timers for initiating and terminating said output pulse.

7. The invention according to claim 6 wherein said switch means is responsive to said output gate means for discharging said capacitor of said RC means to reset said comparator timers.

8. A one-shot delay timer comprising:
   first delay means responsive to an input signal and initiating an output pulse after a given delay; and
   second delay means terminating said output pulse after a given delay, to control the length of said output pulse;
   wherein:
   said delayed output pulse of controlled length is generated for each said input signal except when a second input signal occurs before the termination of said output pulse;
   said delayed output pulse of controlled length is generated regardless of the duration of said input signal, even if said input signal lasts longer than the termination of said output pulse;
   said first delay means comprises a first comparator timer responsive to said input signal and providing a delayed output initiating said output pulse;
   said second delay means comprises a second comparator timer providing a delayed output terminating said output pulse;
   each of said comparator timers includes RC means, and switch means for enabling and disabling charging of the capacitors of said RC means, and comprising output gate means responsive to both of said comparator timers for initiating and terminating said output pulse;
   said switch means is responsive to said output gate means for discharging said capacitor of said RC means to reset said comparator timers;
   said output gate means comprises first and second flip-flops, said first flip-flop being responsive to said input signal and controlling the first said switch means to enable charging of said first comparator timer, said second flip-flop being responsive to the delayed output of said first comparator timer to initiate said output pulse and controlling the second said switch means to enable charging of said second comparator timer, both said flip-flops being responsive to the delayed output of said second comparator timer to terminate said output pulse and to switch both said switch means to discharge both said capacitors of said RC means and reset both said comparator timers.

9. The invention according to claim 8 wherein said first flip-flop is clocked by said input signal, said second flip-flop is clocked by said first comparator timer, and both said flip-flops are reset by said second comparator timer.

10. The invention according to claim 9 comprising intermediate gate means between the output of said second comparator timer and said flip-flop means, and comprising an RC network between the output of said second comparator timer and said intermediate gate means for delaying the output of said second comparator timer and preventing loop oscillation.

11. The invention according to claim 9 wherein said input signal is provided through input gate means to the clock input of said first flip-flop, and wherein the output of said second comparator timer is connected through intermediate gate means to the reset inputs of said first and second flip-flops.

12. The invention according to claim 11 wherein said input gate means comprises a pair of series connected XOR gates, and said intermediate gate means comprises a pair of series connected XOR gates.

13. The invention according to claim 6 wherein each said comparator timer comprises an operational amplifier having a reference input terminal and a comparing input terminal, and having an output whose state is determined by the state of said comparing input terminal relative to said reference input terminal.

14. A one-shot delay timer comprising:
first delay means responsive to an input signal and initiating an output pulse after a given delay; and
second delay means terminating said output pulse after a given delay, to control the length of said output pulse;
wherein:
said delayed output pulse of controlled length is generated for each said input signal except when a second input signal occurs before the termination of said output pulse;
said delayed output pulse of controlled length is generated regardless of the duration of said input signal, even if said input signal lasts longer than the termination of said output pulse;
said first delay means comprises a first comparator timer responsive to said input signal and providing a delayed output initiating said output pulse;
said second delay means comprises a second comparator timer providing a delayed output terminating said output pulse;
each of said comparator timers includes RC means, and switch means for enabling and disabling charging of the capacitors of said RC means, and comprising output gate means responsive to both of said comparator timers for initiating and terminating said output pulse;
each said comparator timer comprises an operational amplifier having a reference input terminal and a comparing input terminal, and having an output whose state is determined by the state of said comparing input terminal relative to said reference input terminal;
each said comparator timer includes potentiometer means comprising:
a voltage source connected through a wiper to a variable point along a pot resistor;
the bottom end of said pot resistor being connected to said reference input terminal of its respective said comparator timer;
the upper end of said pot resistor being connected through its respective said RC means to said comparing input terminal of its respective said comparator timer for comparison against said reference input terminal;
such that when said wiper is moved downwardly, the threshold trip voltage at said reference input terminal is increased, and the charging current to the capacitor said RC means is decreased, such that it takes longer for the voltage at said comparing input terminal to rise in a given polarity direction above the voltage at said reference input terminal; and
such that when said wiper is moved upwardly, the threshold trip voltage at said reference input terminal is decreased, and the charging current to the capacitor said RC means is increased, such that it takes less time for the voltage at said comparing input terminal to rise in a given polarity direction above the voltage at said reference input terminal.

15. A one-shot delay timer comprising:
a first comparator having a reference input terminal and a comparing input terminal, and having an output whose state is determined by the state of said comparing input terminal relative to said reference input terminal;
first RC means in circuit with said first comparator;
first switch means in circuit with said first RC means and responsive to an input signal for enabling or disabling charging of the capacitor said first RC means,
in the enabled mode, the charging of said capacitor of first RC means causes voltage to rise at said comparing input terminal such that said output of said first comparator transitions after a given delay when the voltage at said comparing input terminal rises in a given polarity direction above that at said reference input terminal,
in the disabled mode, said capacitor of said first RC means remains uncharged such that the voltage at said comparing input terminal does not rise above that at said reference input terminal, and the output of said first comparator does not transition;
a second comparator timer having a reference input terminal and a comparing input terminal, and having an output whose state is determined by the state of said comparing input terminal relative to said reference input terminal;
second RC means in circuit with said second comparator;
second switch means in circuit with second RC means for enabling or disabling charging of the capacitor of said second RC means,
in the enabled mode, the charging of said capacitor second RC means causes voltage to rise at said comparing input terminal of said second comparator such that said output of said second comparator transitions after a given delay when the voltage at said comparing input terminal of said second comparator rises in a given polarity direction above that at said reference input terminal of said second comparator,
in the disable mode, capacitor of said second RC means remains uncharged such that the voltage at said comparing input terminal of said second comparator does not rise above that at said reference input terminal of said second comparator, and the output of said second comparator does not transition;
transitioning of said first comparator output initiating an output pulse, and transitioning of said second comparator output terminating said output pulse, the delay in initiation of said output pulse being controlled by said first comparator, the length of said output pulse being controlled by said first comparator, the length of said output pulse being controlled by said second comparator;
said delayed output pulse of controlled length being generated for each said input signal except when a second input signal occurs before the termination of said output pulse;

said delayed output pulse of controlled length being generated regardless of the duration of said input signal, even if said input signal lasts longer than the termination of said output pulse.

16. A proximity switch one-shot delay timer comprising:

a first comparator having a reference input terminal and a comparing input terminal, and having an output whose state is determined by the state of said comparing input terminal relative to said reference input terminal;

first RC means in circuit with said first comparator;

first switch means in circuit with said first RC means and responsive to an input signal for enabling or disabling charging of the capacitor said first RC means, in the enabled mode, the charging of said capacitor of first RC means causes voltage to rise at said comparing input terminal such that said output of said first comparator transitions after a given delay when the voltage at said comparing input terminal rises in a given polarity direction above that at said reference input terminal, in the disabled mode, said capacitor of said first RC means remains uncharged such that the voltage at said comparing input terminal does not rise above that at said reference input terminal, and the output of said first comparator does not transition;

a second comparator timer having a reference input terminal and a comparing input terminal, and having an output whose state is determined by the state of said comparing input terminal relative to said reference input terminal;

second RC means in circuit with said second comparator;

second switch means in circuit with second RC means for enabling or disabling charging of the capacitor of said second RC means, in the enabled mode, the charging of said capacitor second RC means causes voltage to rise at said comparing input terminal of said second comparator such that said output of said second comparator transitions after a given delay when the voltage at said comparing input terminal of said second comparator rises in a given polarity direction above that at said reference input terminal of said second comparator, in the disable mode, capacitor of said second RC means remains uncharged such that the voltage at said comparing input terminal of said second comparator does not rise above that at said reference input terminal of said second comparator, and the output of said second comparator does not transition;

transitioning of said first comparator output initiating and output pulse; and transitioning of said second comparator output terminating said output pulse, the delay in initiation of said output pulse being controlled by said first comparator, the length of said output pulse being controlled by said first comparator, the length of said output pulse being controlled by said second comparator;

said delayed output pulse of controlled length being generated for each said input signal except when a second input signal occurs before the termination of said output pulse;

said delayed output pulse of controlled length being generated regardless of the duration of said input signal, even if said input signal lasts longer than the termination of said output pulse.

* * * * *

UNITED STATES PATENT AND TRADEMARK OFFICE
CERTIFICATE OF CORRECTION

PATENT NO. : 4,560,892
DATED : December 24, 1985
INVENTOR(S) : LAWRENCE J. RYCZEK It is certified that error appears in the above-identified patent and that said Letters Patent is hereby corrected as shown below:

In column 3, line 47, delete "disable" and insert --disabled--

In column 4, line 26, delete "shop" and insert --shot--

In claim 1, column 5, line 16, after "output pulse" delete "is" and insert --of--

Signed and Sealed this

First Day of July 1986

[SEAL]

Attest:

Attesting Officer

DONALD J. QUIGG

Commissioner of Patents and Trademarks